(12) United States Patent
Chen et al.

(10) Patent No.: US 9,484,096 B1
(45) Date of Patent: Nov. 1, 2016

(54) TERNARY CONTENT-ADDRESSABLE MEMORY

(71) Applicant: NATIONAL TSING HUA UNIVERSITY, Hsinchu (TW)

(72) Inventors: Chien-Fu Chen, Hsinchu (TW); Chien-Chen Lin, Hsinchu (TW); Meng-Fan Chang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/954,935

(22) Filed: Nov. 30, 2015

(51) Int. Cl.
*G11C 15/00* (2006.01)
*G11C 15/04* (2006.01)

(52) U.S. Cl.
CPC ............. *G11C 15/04* (2013.01); *G11C 15/043* (2013.01); *G11C 15/046* (2013.01)

(58) Field of Classification Search
CPC ..... G11C 15/04; G11C 15/00; G11C 15/046; G11C 15/043
See application file for complete search history.

(56) References Cited

U.S. PATENT DOCUMENTS

| | | | |
|---|---|---|---|
| 2005/0201132 A1* | 9/2005 | Shin | G11C 15/04 711/108 |
| 2006/0062038 A1* | 3/2006 | Kang | G11C 15/00 365/49.17 |

* cited by examiner

*Primary Examiner* — Richard Elms
*Assistant Examiner* — Mohammed A Bashar
(74) *Attorney, Agent, or Firm* — Li & Cai Intellectual Property (USA) Office

(57) ABSTRACT

A ternary content-addressable memory comprises a first switch, a first static random-access memory cell, a second switch and a second static random-access memory cell. The first switch is connected between a first search line and a match line. The first switch has a first control electrode. The first static random-access memory cell has a first storage node connected to the first control electrode of the first switch. The second switch is connected between a second search line and the match line. The second switch has a second control node. The second static random-access memory cell has a second storage node connected to the second control electrode of the second switch.

14 Claims, 6 Drawing Sheets

| Q1 | Q2 | Data |
|---|---|---|
| 0 | 0 | X |
| 0 | 1 | 0 |
| 1 | 0 | 1 |
| 1 | 1 | Inhibit |

| SL | SLB | Search |
|---|---|---|
| 0 | 0 | Inhibit |
| 0 | 1 | 0 |
| 1 | 0 | 1 |
| 1 | 1 | X |

FIG.4B

| SL | SLB | Search |
|---|---|---|
| 0 | 0 | X |
| 0 | 1 | 1 |
| 1 | 0 | 0 |
| 1 | 1 | Inhibit |

FIG.4C

TERNARY CONTENT-ADDRESSABLE MEMORY

BACKGROUND OF THE INVENTION

1. Field of the Invention

The instant disclosure relates to a ternary content-addressable memory; in particular, to a ternary content-addressable memory with read port and write assist.

2. Description of Related Art

A ternary content-addressable memory stores three types data including data "1", data "0" and data "X". Conventional ternary content-addressable memory comprises two search lines being a search-data pair, two memory cells being a storage-data pair, and a compare circuit. The compare circuit can be a NAND logic or a NOR logic, for example. The search-data pair (search lines) and the storage-data pair (two memory cells) are connected to the compare logic which discharges the match line when the logic status of the search-data pair is different from the data in the storage-data pair. As an example, referring to FIG. 1 showing a circuit diagram of a conventional 6T SRAM-based ternary content-addressable memory. A first SRAM 801 and a second SRAM 802 are connected to a compare circuit 803. The compare circuit 803 has a pair of NOR type compare logics. Another example is shown in FIG. 2. A first SRAM 901 and a second SRAM 902 constituting the storage-data pair are both a 4T SRAM cell. The compare circuit 903 is similar to the compare circuit 803 shown in FIG. 1. Research and development of new designs for the ternary content-addressable memory is still ongoing.

SUMMARY OF THE INVENTION

The object of the instant disclosure is to provide a ternary content-addressable memory with read port and write assist.

In order to achieve the aforementioned objects, according to an embodiment of the instant disclosure, a ternary content-addressable memory is provided. The ternary content-addressable memory comprises a first switch, a first static random-access memory cell, a second switch and a second static random-access memory cell. The first switch is connected between a first search line and a match line. The first switch has a first control electrode. The first static random-access memory cell has a first storage node connected to the first control electrode of the first switch. The second switch is connected between a second search line and the match line. The second switch has a second control node. The second static random-access memory cell has a second storage node connected to the second control electrode of the second switch.

In summary, the provided ternary content-addressable memory has two read port and simple compare circuit; with no read/write disturb issue when performing the search operation.

In order to further the understanding regarding the instant disclosure, the following embodiments are provided along with illustrations to facilitate the disclosure of the instant disclosure.

BRIEF DESCRIPTION OF THE DRAWINGS

FIG. 4B illustrates a table showing the program states of the ternary content-addressable memory shown in FIG. 3 in the operation of searching the data;

FIG. 4C illustrates a table showing the program states of the ternary content-addressable memory shown in FIG. 3 in the operation of searching the data;

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figures 3, 4A:
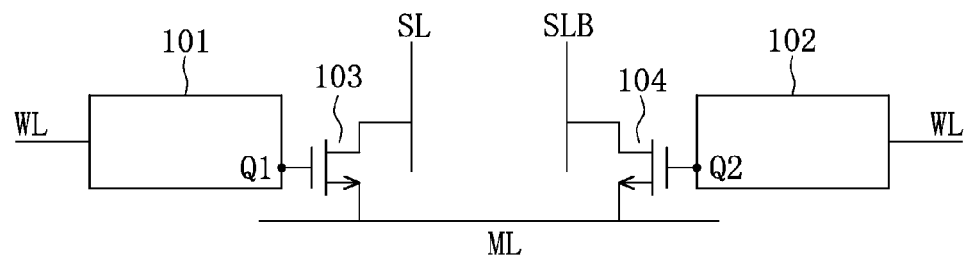
FIG. 3 shows a circuit diagram of a ternary content-addressable memory according to an embodiment of the instant disclosure.
FIG. 4A illustrates a table showing the data pattern of the ternary content-addressable memory shown in FIG. 3.

Please refer to FIG. 3 showing a circuit diagram of a ternary content-addressable memory according to an embodiment of the instant disclosure. The ternary content-addressable memory comprises a first switch 103, a first static random-access memory cell 101, a second switch 104 and a second static random-access memory cell 102.

The first switch 103 is connected between a first search line SL and a match line ML. The first switch 103 has a first control electrode. The first switch 103 can be a transistor, for example an NMOS transistor or a PMOS transistor, but the instant disclosure is no so restricted. As shown in FIG. 3, the first switch 103 is an NMOS transistor whose gate electrode is the first control electrode. A drain electrode of the transistor is connected to the first search line SL, and a source electrode of the transistor is connected to the match line ML.

The second switch 104 is connected between a second search line SLB and the match line ML. The second switch 104 has a second control node. The second switch 104 can be a transistor, for example an NMOS transistor or a PMOS transistor, but the instant disclosure is no so restricted. As shown in FIG. 3, the second switch 104 is an NMOS transistor whose gate electrode is the second control electrode. A drain electrode of the transistor is connected to the second search line SLB, and a source electrode of the transistor is connected to the match line ML.

The first static random-access memory cell 101 has a first storage node Q1 connected to the first control electrode of the first switch 103. The second static random-access memory cell 102 has a second storage node Q2 connected to the second control electrode of the second switch 104. The first static random-access memory cell 101 and the second static random-access memory cell 102 are respectively connected to a write bit line WL for writing data.

Furthermore, an example of the data pattern of the ternary content-addressable memory shown in FIG. 3 is shown in the table of FIG. 4A. The ternary content-addressable memory stores data "X" (don't care) when the first static random-access memory cell 101 stores a logic "0" value (which means the logic state of the first storage node Q1 is "LOW") and the second static random-access memory cell 102 stores the logic "0" value (which means the logic state of the second storage node Q2 is "LOW"). The ternary content-addressable memory stores data "0" when the first static random-access memory cell 101 stores the logic "0" value (which means the logic state of the first storage node Q1 is "LOW") and the second static random-access memory cell 102 stores a logic "1" value (which means the logic state of the second storage node Q2 is "HIGH"). The ternary content-addressable memory stores data "1" when the first static random-access memory cell 101 stores the logic "1" value (which means the logic state of the first storage node Q1 is "HIGH") and the second static random-access memory cell 102 stores the logic "0" value (which means the logic state of the second storage node Q2 is "LOW"). An inhibit data state with the first static random-access memory cell 101 and the second static random-access memory cell 102 are both storing the logic "1" value is not intended to be stored to the proposed ternary content-addressable memory. However, the data pattern of the ternary content-addressable memory is not restricted thereto. In another example, the ternary content-addressable memory stores data "0" when the first static random-access memory cell 101 stores the logic "1" value and the second static random-access memory cell 102 stores a logic "0" value. The ternary content-addressable memory stores data "1" when the first static random-access memory cell 101 stores the logic "0" value and the second static random-access memory cell 102 stores the logic "1" value. Above data pattern are proposed for ease of description. An artisan of ordinary skill in the art will appreciate how to define the data pattern applied to proper applications.

Figure 1:
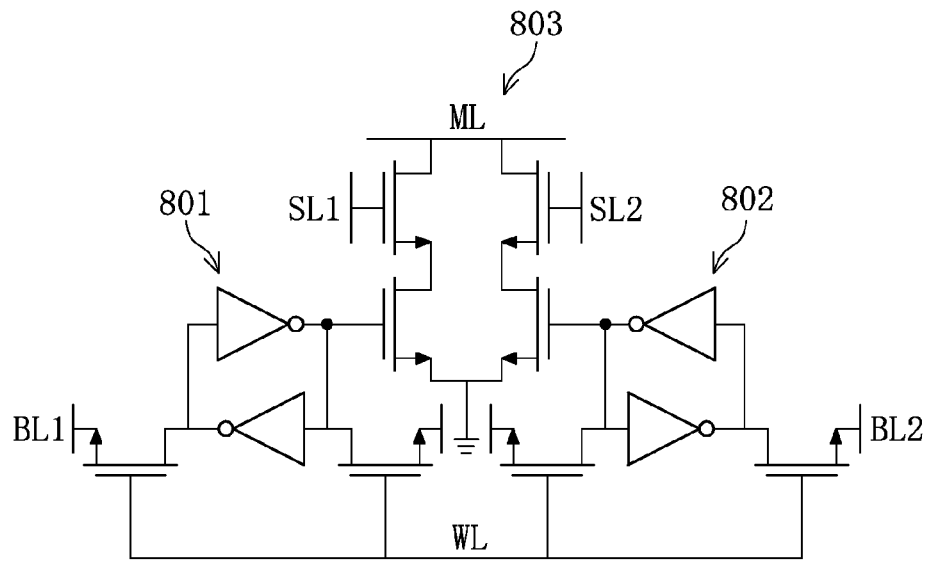
FIG. 1 shows a circuit diagram of a conventional 6T SRAM-based ternary content-addressable memory.
Figure 2:
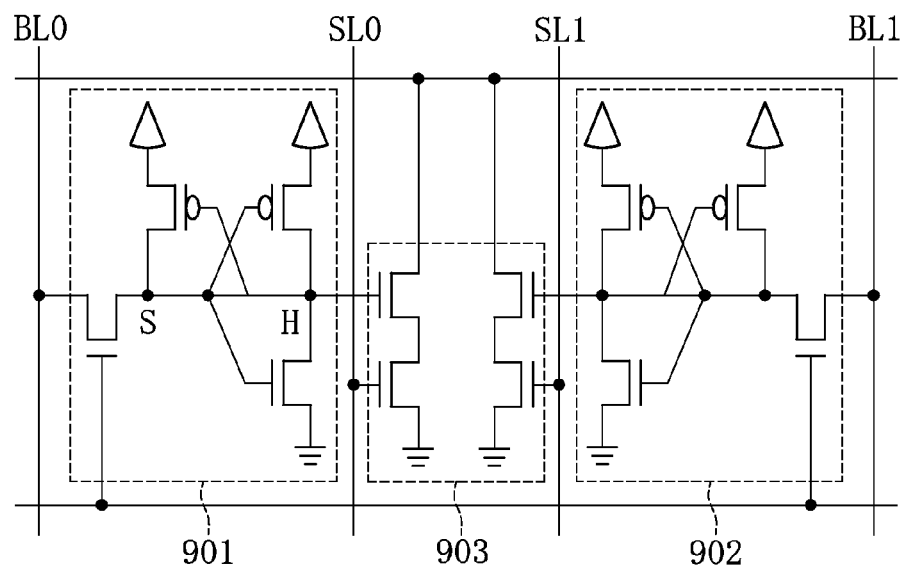
FIG. 2 shows a circuit diagram of a conventional 12T SRAM-based ternary content-addressable memory.

The first static random-access memory cell 101 and the second static random-access memory cell 102 can be any type of SRAM cell. For example, the first static random-access memory cell 101 and the second static random-access memory cell 102 can the 6T SRAM shown in FIG. 1 or the 4T SRAM shown in FIG. 2, but the instant disclosure is not restricted thereto.

The operation of searching the data is described as follows. Please refer to FIG. 4B. FIG. 4B illustrates a table showing the program states of the ternary content-addressable memory shown in FIG. 3 in the operation of searching the data. The ternary content-addressable memory comprises an operation of searching for data "1", an operation of searching for data "0" and an operation of searching for data "X" (don't care).

In one embodiment, referring to the data pattern described in FIG. 4A and program states described in FIG. 4B the first search line SL, the second search line SLB and the match line ML are precharged at a logic high voltage before searching the data. Referring to FIG. 4B, during the operation of searching for data "1", the first search line SL and the second search line SLB are respectively set to the logic high voltage ("1") and a logic low voltage ("0"). During the operation of searching for data "0", the first search line SL and the second search line SLB are respectively set to the logic low voltage ("0") and the logic high voltage ("1"). During the operation of searching for data "X" (don't care), the first search line SL and the second search line SLB are both set to the logic high voltage ("1"). An inhibit status of the first search line SL and the second search line SLB is when both of the first search line SL and the second search line SLB are at low voltage ("0").

Figure 5:
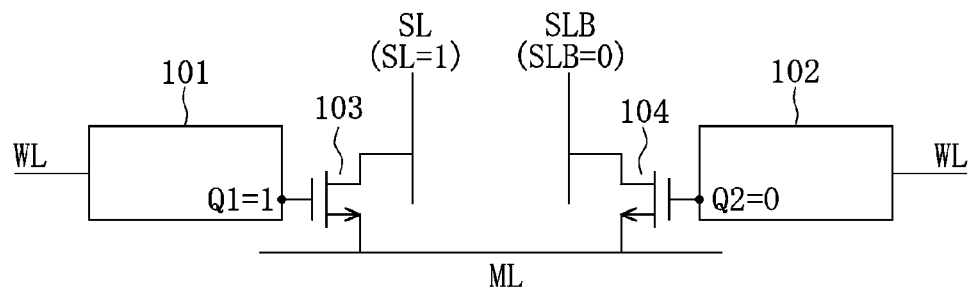
FIG. 5 shows a circuit diagram of the ternary content-addressable memory shown in FIG. 3 with logic status during the operation of searching for data "1"

Based on above description, the data match result and miss-match result is described as follows. When performing the operation of searching for data "1", referring to FIG. 5, if the first storage node Q1 is HIGH and the second storage node Q2 is LOW (which means the ternary content-addressable memory stores data "1"), the search operation result is a match. The first switch 103 has no current due to both the data and the first search line being "1" (logic high voltage). The second switch 104 has no current due to the gate electrode being controlled to turn off the second switch by the low voltage of the second storage node (Q2=0). Therefore, the voltage or logic state of the match line ML would not be changed. On the contrary, again when performing the operation of searching for data "1", but the first storage node Q1 is LOW and the second storage node Q2 is HIGH (which means the ternary content-addressable memory stores data "0"), the search operation result is miss-match, wherein the first switch 103 is turned off (no current) and the second switch 104 is turned on for discharging the match line ML.

Figure 6:
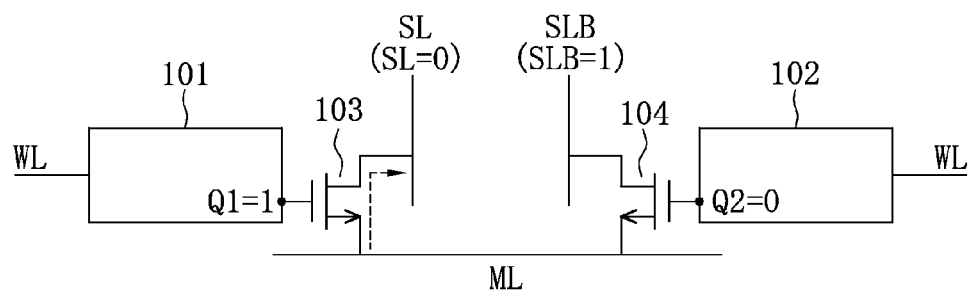
FIG. 6 shows a circuit diagram of the ternary content-addressable memory shown in FIG. 3 with logic status during the operation of searching for data "0"

When performing the operation of searching for data "0", referring FIG. 6, if the first storage node Q1 is HIGH and the second storage node Q2 is LOW (which means the ternary content-addressable memory stores data "1"), the search operation result is match. The first switch 103 has read current due to data being "1" (the first storage node Q1 (Q1=1) turns on the first switch 103) and the first search line is at low voltage (SL=0). Accordingly, the voltage or logic state of the match line ML would be changed. The second switch 104 has no current due to its gate electrode being controlled to turn off the second switch by low voltage of the second storage node (Q2=0). On the contrary, again when performing the operation of searching for data "0", but the first storage node Q1 is LOW and the second storage node Q2 is HIGH (which means the ternary content-addressable memory stores data "0"), the search operation result is match, wherein the first switch 103 is turned off (no current) and the second switch 104 is turned on for discharging the match line ML.

Figure 7:
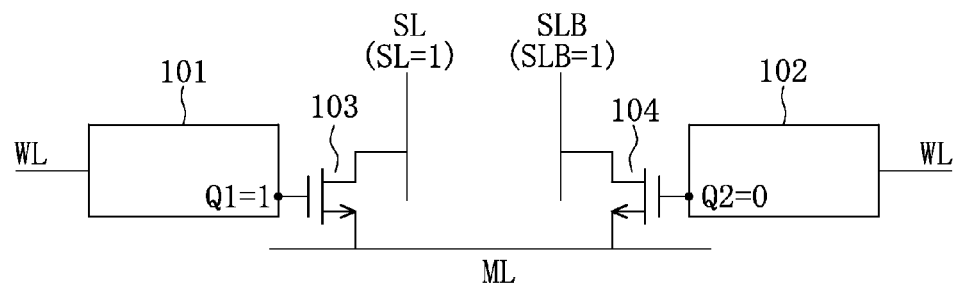
FIG. 7 shows a circuit diagram of the ternary content-addressable memory shown in FIG. 3 with logic status during the operation of searching for data "X" (don't care)

When performing the operation of searching for data "X" (don't care), referring to FIG. 7, if the first storage node Q1 is HIGH and the second storage node Q2 is LOW (which means the ternary content-addressable memory stores data "1"), the search operation result is match. The first switch 103 has no current due to both the first search line SL and the match line ML are at high voltage (SL=1, ML is precharged to the high voltage). The second switch 104 has no current due to its gate electrode being controlled to turn off the second switch 104 by low voltage of the second storage node (Q2=0). Accordingly, the voltage or logic state of the match line ML would not be changed. In the same way, if the first storage node Q1 is LOW and the second storage node Q2 is HIGH (which means the ternary content-addressable memory stores data "0"), the search operation result is still match.

Furthermore, an alternative search operation for the ternary content-addressable memory shown in FIG. 3 is described as follows. Referring to the data pattern described in FIG. 4A and program states described in FIG. 4C, the first search line SL, the second search line SLB and the match line ML are preset at a logic low voltage before searching the data. During the operation of searching for data "1", the first search line SL and the second search line SLB are respectively set to the logic low voltage and the logic high voltage. During the operation of searching for data "0", the first search line SL and the second search line SLB are respectively set to the logic high voltage and the logic low voltage. During the operation of searching for data "X" (don't care), the first search line SL and the second search line SLB are both set to the logic low voltage. Match result or miss-match result also depends on the switching status of the first switch 103 and the second switch 104.

Figure 8:
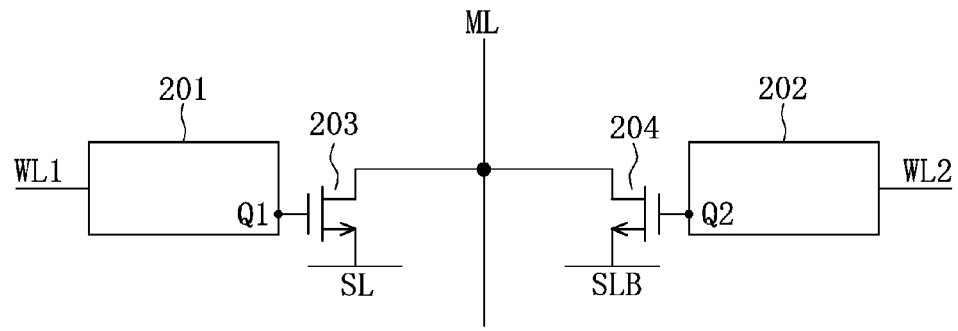
FIG. 8 shows a circuit diagram of a ternary content-addressable memory according to another embodiment of the instant disclosure.

Another embodiment of the ternary content-addressable memory is shown in FIG. 8. Different from the embodiment of FIG. 3, the drain electrode of the first switch 203 is connected to the match line ML, and the source electrode of the first switch 203 is connected to the first search line SL. Furthermore, the drain electrode of the second switch 204 is connected to the match line ML, and the source electrode of the second switch 204 is connected to the second search line SLB. The search operation of the ternary content-addressable memory shown in FIG. 8 can be referred to the search operation of the previous embodiment shown in FIG. 3.

Furthermore, compared to the data pattern described in FIG. 4A, we can exchange the first static random-access memory cell 101 and the second static random-access memory cell 102. That is, the data pattern can be the ternary content-addressable memory stores data "0" when the first static random-access memory cell 101 stores the logic "1" value and the second static random-access memory cell 102 stores a logic "0" value. The ternary content-addressable memory stores data "1" when the first static random-access memory cell 101 stores the logic "0" value and the second static random-access memory cell 102 stores the logic "1" value. Analogy to the search data operation described in FIG. 4B and based on exchange of the first static random-access memory cell 101 and the second static random-access memory cell 102, the first search line, the second search line and the match line are precharged at a logic high voltage before searching the data, wherein during the operation of searching for data "1", the first search line and the second search line are respectively set to the logic low voltage and a logic high voltage; during the operation of searching for data "0", the first search line and the second search line are respectively set to the logic high voltage and the logic low voltage; during the operation of searching for data "X" (don't care), the first search line and the second search line are both set to the logic high voltage. Similarly, analogy to the search data operation described in FIG. 4C and based on exchange of the first static random-access memory cell 101 and the second static random-access memory cell 102, the first search line, the second search line and the match line are preset at a logic low voltage before searching for data, wherein during the operation of searching for data "1", the first search line and the second search line are respectively set to the logic high voltage and a logic low voltage; during the operation of searching for data "0", the first search line and the second search line are respectively set to the logic low voltage and the logic high voltage; during the operation of searching for data "X" (don't care), the first search line and the second search line are both set to the logic low voltage.

Figure 9:
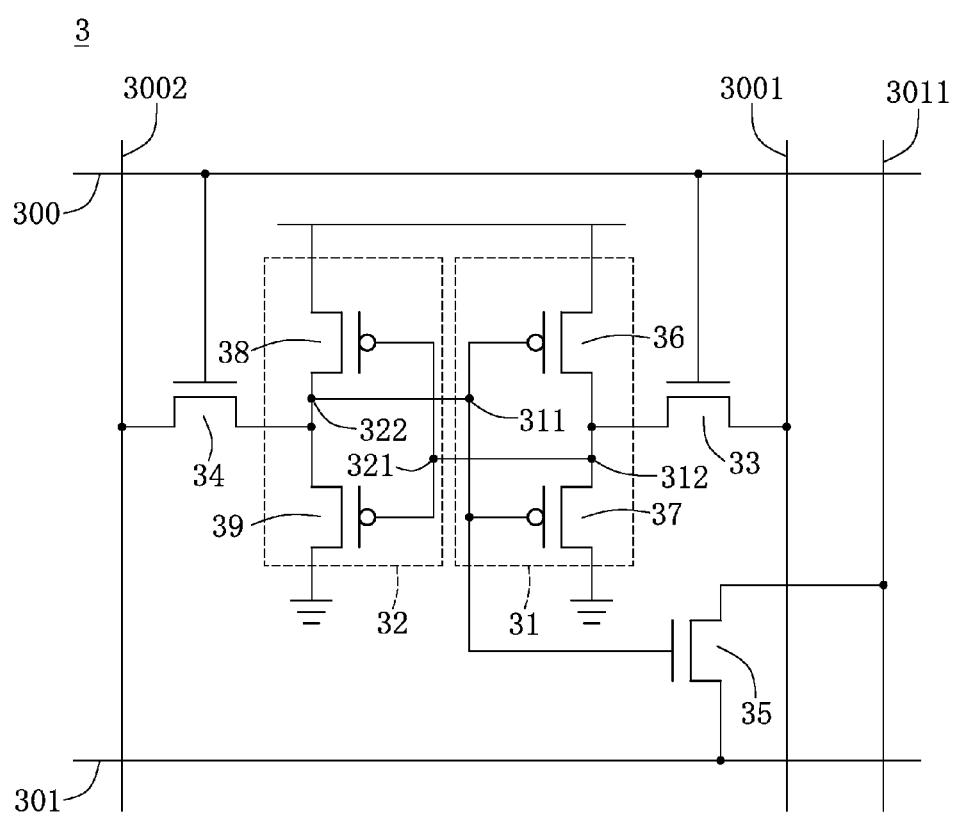
FIG. 9 shows a circuit diagram of a first static random-access memory cell (or a second static random-access memory cell) of a ternary content-addressable memory according to an embodiment of the instant disclosure.

Regarding to the first static random-access memory cell 101 (or 201) and the second static random-access memory cell 102 (or 202) shown in FIG. 3 (or FIG. 8), a detailed embodiment is provided in the following embodiment. With reference to FIG. 9 for a schematic view of a SRAM cell in accordance with the first preferred embodiment of the present invention, the SRAM cell is a seven-transistor SRAM cell 3 comprising a first inverter 31, a second inverter 32, a first transistor 33, and a second transistor 34. A transistor 35 can be regarded as the first switch 103 (or 203) or the second switch 104 (or 204). When applying the SRAM of FIG. 9 into the aforementioned first SRAM cell 101 shown in FIG. 3 (or the first SRAM cell 201 shown in FIG. 8), the transistor 35 is regarded as the first switch 103 (or the first switch 203).

The first inverter 31 includes a first input node 311 and a first output node 312, and the second inverter 32 includes a second input node 321 and a second output node 322. The first inverter 31 and the second inverter 32 are cross-coupled. In other words, the first output node 312 is coupled to the second input node 321, and the second output node 322 is coupled to the first input node 311 to form a latch circuit for storing data.

In addition, a gate of the first transistor 33 is coupled to a write word line 200, and a drain of the first transistor 33 is coupled to first output node 312, and a source of the first transistor 33 is coupled to a write bit line 3001. A gate of the second transistor 34 is the same as the gate of the first transistor 33 and coupled to a write word line 300, and a drain of the second transistor 34 is coupled to the second output node 322, and a source of the second transistor 34 is coupled to a complementary write bit line 3002 which is complementary to the write bit line 3001. A gate of the transistor 35 is coupled to the first input node 311, and a drain of the transistor 35 is coupled to a match line 301, and a source of the transistor 35 is coupled to a read bit line 3011. When the SRAM cell 3 is the first SRAM cell 101 (or 201) the first input node 311 is the first storage node Q1. When the SRAM cell 3 is the second SRAM cell 102 (or 202) the first input node 311 is the second storage node Q2. In other words, the transistor 35 is coupled to the match line 201 and the read bit line 3011 to form a read port transistor, so that the SRAM cell 3 has a read port. As a result, the SRAM cell 3 can read and write data independently without the need of sharing the word line when accessing the data.

When the SRAM cell 3 is in a hold mode, all of the bit lines including the write bit line 3001, the complementary write bit line 3002 and the read bit line 3011 are charged in advance and maintained at a high voltage level such as the operating voltage higher than the low voltage level of the write word line 300, or a ground or zero-volt voltage, and the match line 301 is maintained at a high voltage level such as the operating voltage. When the SRAM cell 3 is in a read mode, the voltage of the match line 301 is released to a low voltage level such as the ground or zero-volt voltage. As a result, the stability of the memory cell is improved during a reading process and the possibility of having a read error or failure can be reduced.

In addition, the first inverter 31 is formed by coupling a third transistor 36 and a fourth transistor 37. A gate of the third transistor 36 is coupled to a gate of the fourth transistor 37, and a drain of the third transistor 36 is coupled to a drain of the fourth transistor 37, and a source of the third transistor 36 and a source of the fourth transistor 37 are coupled to a power source and the ground respectively. Similarly, the second inverter 32 is formed by coupling a fifth transistor 38 and a sixth transistor 39. A gate of the fifth transistor 38 is coupled to a gate of the sixth transistor 39, and a drain of the fifth transistor 38 is coupled to a drain of the sixth transistor 39, and a source of the fifth transistor 38 and a source of the sixth transistor 39 are coupled to the power source and the ground respectively.

In the description above, the SRAM cell of the instant disclosure is formed by coupling six transistors 33, 34, 36, 37, 38, 39 and the transistor 35. Each of the seven transistors can be a P-MOS or an N-MOS. For example, the first transistor 33 and the second transistor 34 can be the N-MOS or P-MOS, and the transistor 35 can be the N-MOS or a low threshold voltage N-MOS. The third transistor 36 and fourth transistor 37 of the first inverter 31 can be the P-MOS and the N-MOS. The fifth transistor 38 and sixth transistor 29 of the second inverter 32 can be the P-MOS and the N-MOS respectively. It is noteworthy to point out that persons ordinarily skilled in the art should understand that circuit components such as the seven transistors of the instant disclosure can be the P-MOS or the N-MOS transistor. The SRAM cell in accordance with the aforementioned preferred embodiment of the present invention is provided for illustrating the invention only, but not intended for limiting the scope of the invention. Persons ordinarily skilled in the art should understand that the circuit components such as the transistors of the SRAM cell of the instant disclosure can be substituted by a bipolar transistor or a combination of the bipolar transistor and the field-effect transistor without departing from the scope and spirit of the instant disclosure.

According to above descriptions, the provided ternary content-addressable memory has two read port and simple compare circuit; with no read/write disturb issue when performing the search operation.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A ternary content-addressable memory, comprising:
a first switch, connected between a first search line and a match line, the first switch having a first control electrode;
a first static random-access memory cell, having a first storage node connected to the first control electrode of the first switch;
a second switch, connected between a second search line and the match line, the second switch having a second control node; and
a second static random-access memory cell, having a second storage node connected to the second control electrode of the second switch;
wherein the first switch is a transistor, the first control electrode is a gate electrode of the transistor, a drain electrode of the transistor is directly connected to the first search line, and a source electrode of the transistor is directly connected to the match line;
wherein the second switch is a transistor, the second control electrode is a gate electrode of the transistor, a drain electrode of the transistor is directly connected to the second search line, and a source electrode of the transistor is directly connected to the match line.

2. The ternary content-addressable memory according to claim 1, wherein the ternary content-addressable memory stores data "1" when the first static random-access memory cell stores a logic "1" value and the second static random-access memory cell stores a logic "0" value; wherein the ternary content-addressable memory stores data "0" when the first static random-access memory cell stores a logic "0" value and the second static random-access memory cell stores a logic "1" value.

3. The ternary content-addressable memory according to claim 1, wherein the ternary content-addressable memory stores data "1" when the first static random-access memory cell stores a logic "0" value and the second static random-access memory cell stores a logic "1" value; wherein the ternary content-addressable memory stores data "0" when the first static random-access memory cell stores a logic "1" value and the second static random-access memory cell stores a logic "0" value.

4. The ternary content-addressable memory according to claim 2, wherein the ternary content-addressable memory stores data "X" (don't care) when the first static random-access memory cell stores a logic "0" value and the second static random-access memory cell stores a logic "0" value.

5. The ternary content-addressable memory according to claim 3, wherein the ternary content-addressable memory stores data "X" (don't care) when the first static random-access memory cell stores a logic "0" value and the second static random-access memory cell stores a logic "0" value.

6. The ternary content-addressable memory according to claim 4, wherein the ternary content-addressable memory comprises an operation of searching for data "1", an operation of searching for data "0" and an operation of searching for data "X" (don't care).

7. The ternary content-addressable memory according to claim 6, wherein the first search line, the second search line and the match line are precharged at a logic high voltage before searching for data "1", data "0" and data "X", wherein during the operation of searching for data "1", the first search line and the second search line are respectively set to the logic high voltage and a logic low voltage; during the operation of searching for data "0", the first search line and the second search line are respectively set to the logic low voltage and the logic high voltage; during the operation of searching for data "X" (don't care), the first search line and the second search line are both set to the logic high voltage.

8. The ternary content-addressable memory according to claim 6, wherein the first search line, the second search line and the match line are preset at a logic low voltage before searching for data "1", data "0" and data "X", wherein during the operation of searching for data "1", the first search line and the second search line are respectively set to the logic low voltage and a logic high voltage; during the operation of searching for data "0", the first search line and the second search line are respectively set to the logic high voltage and the logic low voltage; during the operation of searching for data "X" (don't care), the first search line and the second search line are both set to the logic low voltage.

9. The ternary content-addressable memory according to claim 5, wherein the ternary content-addressable memory comprises an operation of searching for data "1", an operation of searching for data "0" and an operation of searching for data "X" (don't care).

10. The ternary content-addressable memory according to claim 9, wherein the first search line, the second search line and the match line are precharged at a logic high voltage before searching for data "1", data "0" and data "X", wherein during the operation of searching for data "1", the first search line and the second search line are respectively set to the logic low voltage and a logic high voltage; during the operation of searching for data "0", the first search line and the second search line are respectively set to the logic high voltage and the logic low voltage; during the operation of searching for data "X" (don't care), the first search line and the second search line are both set to the logic high voltage.

11. The ternary content-addressable memory according to claim 9, wherein the first search line, the second search line and the match line are preset at a logic low voltage before searching for data "1", data "0" and data "X", wherein during the operation of searching for data "1", the first search line and the second search line are respectively set to the logic high voltage and a logic low voltage; during the operation of searching for data "0", the first search line and the second search line are respectively set to the logic low voltage and the logic high voltage; during the operation of searching for data "X" (don't care), the first search line and the second search line are both set to the logic low voltage.

12. The ternary content-addressable memory according to claim 1, wherein the first static random-access memory cell and the second static random-access memory cell are both a 6T static random-access memory cell, wherein the 6T static random-access memory cell consists of:
- a first inverter, including a first input node and a first output node, wherein the first input node is the first storage node or the second storage node;
- a second inverter, including a second input node and a second output node, and the second input node being coupled to the first output node, and the second output node being coupled to the first input node;
- a first transistor, coupled to a write word line, a write bit line and the first output node;
- a second transistor, coupled to a complementary write bit line, the write word line and the second output node;
- wherein the first inverter includes a third transistor and a fourth transistor, the third transistor is coupled to the fourth transistor through the first output node, and the first input node is coupled to a gate electrode of the third transistor and a gate electrode of the fourth transistor; and
- wherein the second inverter includes a fifth transistor and a sixth transistor, the fifth transistor is coupled to the sixth transistor through the second output node, and the second input node is coupled to a gate electrode of the fifth transistor and a gate electrode of the sixth transistor.

13. The ternary content-addressable memory according to claim 12, wherein the first transistor includes a gate electrode coupled to the write word line, a drain electrode coupled to the first output node, and a source electrode coupled to the write bit line.

14. The ternary content-addressable memory according to claim 12, wherein the second transistor includes a gate electrode coupled to the write word line, a drain electrode coupled to the second output node, and a source electrode coupled to the complementary write bit line.

* * * * *